(12) United States Patent
Yoon et al.

(10) Patent No.: US 8,614,913 B2
(45) Date of Patent: Dec. 24, 2013

(54) METHOD AND APPARATUS FOR CONTROLLING PAGE BUFFER OF NON-VOLATILE MEMORY DEVICE

(75) Inventors: Han Bin Yoon, Hwaseong-si (KR); Yeong-Jae Woo, Suwon-si (KR); Jung Been Im, Anyang-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 505 days.

(21) Appl. No.: 13/028,313

(22) Filed: Feb. 16, 2011

(65) Prior Publication Data

US 2011/0199822 A1    Aug. 18, 2011

(30) Foreign Application Priority Data

Feb. 17, 2010  (KR) ................. 10-2010-0014184

(51) Int. Cl.
*G11C 11/34*    (2006.01)

(52) U.S. Cl.
USPC ............ 365/185.02; 365/185.12; 365/185.17

(58) Field of Classification Search
None
See application file for complete search history.

(56) References Cited

U.S. PATENT DOCUMENTS

| 6,813,184 | B2* | 11/2004 | Lee ............................ 365/185.09 |
| 7,180,783 | B2* | 2/2007 | Kim et al. ................. 365/185.22 |
| 7,684,238 | B2* | 3/2010 | Mo ............................ 365/185.03 |

* cited by examiner

*Primary Examiner* — Alexander Sofocleous
(74) *Attorney, Agent, or Firm* — Volentine & Whitt, PLLC

(57) ABSTRACT

A method of managing a page buffer of a non-volatile memory device comprises programming least significant bit (LSB) page data from an LSB page buffer into a page of memory cells, and retaining the LSB page data in the LSB page buffer until most significant bit (MSB) page data corresponding to the LSB page data is programmed in the page.

20 Claims, 5 Drawing Sheets

METHOD AND APPARATUS FOR CONTROLLING PAGE BUFFER OF NON-VOLATILE MEMORY DEVICE

CROSS-REFERENCE TO RELATED APPLICATIONS

This application claims priority under 35 U.S.C. §119 to Korean Patent Application No. 10-2010-0014184 filed on Feb. 17, 2010, the disclosure of which is hereby incorporated by reference in its entirety.

BACKGROUND OF THE INVENTION

Embodiments of the inventive concept relate generally to methods and apparatuses for controlling a page buffer of a non-volatile memory device. More particularly, embodiments of the inventive concept relate to methods and apparatuses for managing a page buffer to retain least significant bit (LSB) page data until programming of most significant bit (MSB) page data is completed.

In an effort to increase the storage density of non-volatile memory devices, researchers have developed non-volatile memory devices that can store more than one bit of data per memory cell. For instance, researchers have developed flash memory devices that can store two or more bits per memory cell. Such memory devices are commonly referred to as multi-level cell (MLC) devices.

In some MLC devices, selected memory cells are programmed by first programming lower order bits, such as LSB bits, and then programming upper order bits, such as MSB bits. The selected memory cells can be arranged in pages, where each page comprises a plurality of memory cells connected to a common word line. A page of memory cells in an MLC device can be programmed with a page of LSB data, referred to as LSB page data, and subsequently programmed with a page of MSB data, referred to as MSB page data.

Because the MSB page data is generally programmed after the LSB page data, a failure to properly program the MSB page data can disturb the previously programmed LSB page data.

SUMMARY OF THE INVENTION

Embodiments of the inventive concept provide methods and apparatuses for managing a page buffer in a non-volatile memory device. These methods and apparatuses retain LSB page data in the page buffer until MSB page data is programmed successfully in a page of memory cells containing the LSB page data.

According to one embodiment of the inventive concept, a method of operating a non-volatile memory device comprises programming LSB page data, stored in an LSB page buffer, to a page of memory cells within the non-volatile memory device, and retaining the LSB page data in the LSB page buffer until MSB page data corresponding to the LSB page data is programmed in the page of memory cells.

In certain embodiments, the method further comprises releasing the LSB page buffer after the MSB page data is successfully programmed in the page of memory cells.

In certain embodiments, the non-volatile memory device is a flash memory device, and the memory cells are arranged in a NAND flash configuration.

In certain embodiments, the method further comprises performing a program operation to program the MSB page data in the page of memory cells, determining whether the MSB page data is successfully programmed in the page of memory cells, and upon determining that the MSB page data is not successfully programmed in the page of memory cells, identifying a memory block containing the page of memory cells as a bad block.

In certain embodiments, the method further comprises performing a program operation to program the MSB page data in the page of memory cells, determining whether the MSB page data is successfully programmed in the page of memory cells, and upon determining that the MSB page data is not successfully programmed in the page of memory cells, recovering the LSB page data from the LSB page buffer and programming the recovered LSB page data in another page of memory cells in the non-volatile memory device.

According to another embodiment of the inventive concept, a non-volatile memory device comprises a page buffer configured to store LSB page data to be programmed in a page of memory cells, and a control block configured to control the page buffer to retain the LSB page data until MSB page data corresponding to the LSB page data is programmed in the page of memory cells.

In certain embodiments, the control block comprises a determination circuit for determining whether or not the MSB page data is programmed in the page, and a control circuit for controlling operations of the page buffer according to a determination result of the determination circuit.

In certain embodiments, as a consequence of the determination circuit determining that the MSB page data is successfully programmed in the page, the control circuit generates a release signal to release the LSB page data stored in the page buffer.

In certain embodiments, as a consequence of the determination circuit determining that the MSB page data is not successfully programmed in the page of memory cells, the control circuit controls the non-volatile memory device to identify a memory block containing the page of memory cells as a bad block.

In certain embodiments, as a consequence of the determination circuit determining that the MSB page data is not successfully programmed in the page of memory cells, the control circuit controls the non-volatile memory device to recover the LSB page data from the LSB page buffer and program the recovered LSB page data in another page of memory cells in the non-volatile memory device.

In certain embodiments, the page comprises a plurality of multi-level flash memory cells.

In certain embodiments, the non-volatile memory device is a flash memory device, and the page comprises a plurality of multi-level cells arranged in a NAND flash configuration.

According to another embodiment of the inventive concept, a data processing system comprises a non-volatile memory device and a controller. The non-volatile memory device comprises a page of memory cells, a page buffer configured to store LSB page data to be programmed in the page of memory cells, and a control block configured to control the page buffer to retain the LSB page data until MSB page data is programmed in the page of memory cells. The controller is configured to output the LSB page data and the MSB page data to the non-volatile memory device.

In certain embodiments, the control block comprises a determination circuit configured to determine whether the MSB page data is programmed in the page, and a control circuit configured to control an operation of the page buffer according to a determination result produced by the determination circuit.

In certain embodiments, as a consequence of the determination circuit determining that the MSB page data is successfully programmed in the page, the control circuit releases the LSB page data stored in the page buffer.

In certain embodiments, the data processing system is a memory card.

In certain embodiments, the data processing system is a solid state drive.

In certain embodiments, the page comprises a plurality of multi-level flash memory cells.

In certain embodiments, the multi-level flash memory cells are arranged in a NAND flash configuration.

In certain embodiments, the multi-level flash memory cells are 2-bit flash memory cells.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

In certain embodiments, a page buffer stores LSB page data that has been programmed in a page of memory cells until MSB page data is successfully programmed in the same memory cells. This allows the LSB data to be recovered if the MSB page data is not successfully programmed in the selected memory cells.

Figure 1:
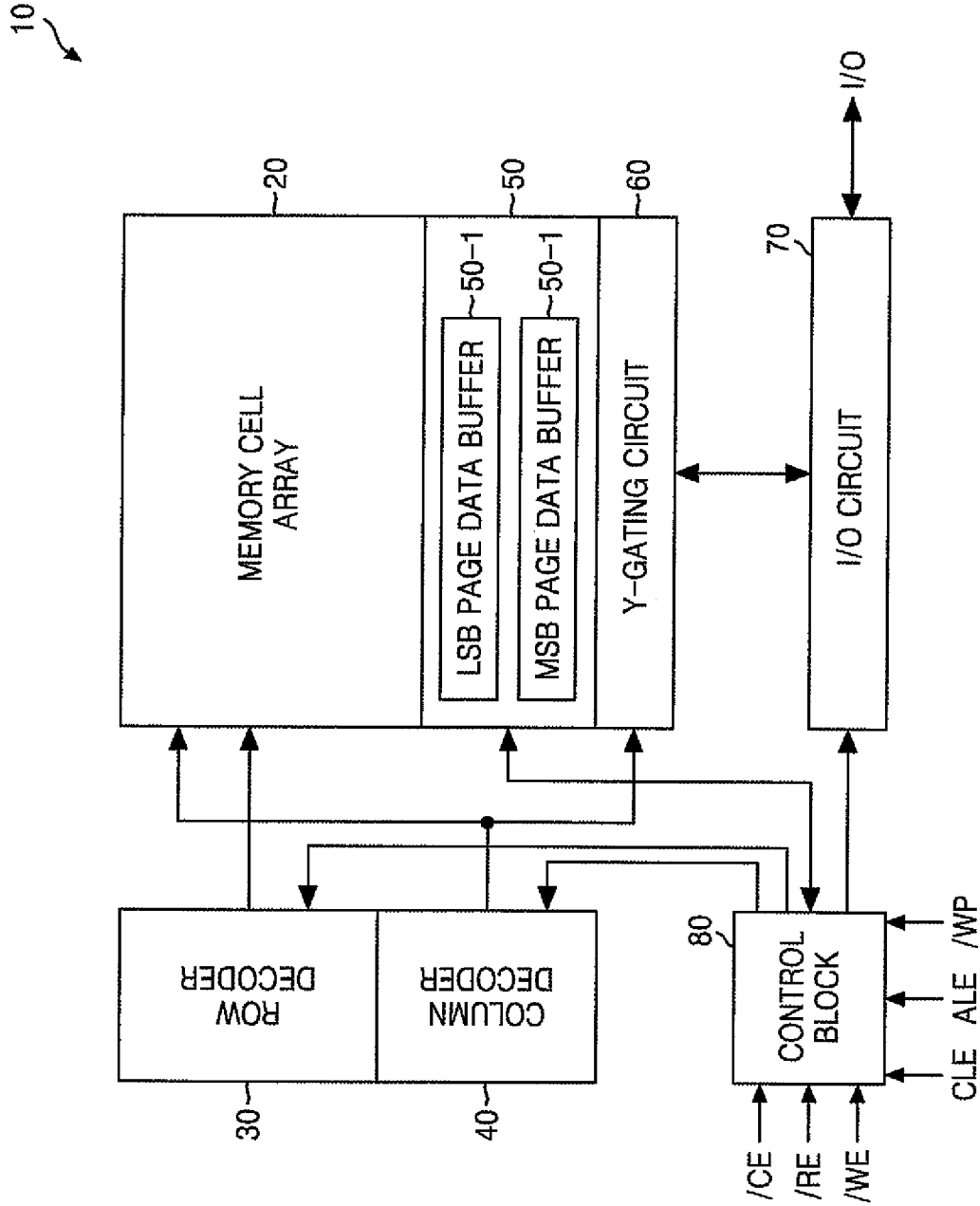
FIG. 1 is a block diagram of a non-volatile memory device according to an embodiment of the inventive concept.

FIG. 1 is a block diagram of a non-volatile memory device 10 according to an embodiment of the inventive concept. Referring to FIG. 1, non-volatile memory device 10 comprises a memory cell array 20, a row decoder 30, a column decoder 40, a page buffer 50, a Y-gating circuit 60, an input/output circuit 70, and a control block 80.

Memory cell array 20 comprises a plurality of blocks. Each of the plurality of blocks is erased as a unit. In other words, the non-volatile memory cells in each block are erased together by a single erase operation.

Each of the plurality of blocks comprises a plurality of pages, and each of the plurality of pages comprises a plurality of non-volatile memory cells. Each of the non-volatile memory cells is configured to store two or more bits of data. Accordingly, each page of memory cells can store multiple pages of data. For instance, a page of non-volatile memory cells can store a page of LSB data and a page of MSB data.

The non-volatile memory cells can be arranged in a NAND configuration where each page of non-volatile memory cells is connected to a common wordline, and the non-volatile memory cells within each page can be accessed in parallel by selecting the wordline.

During a program, read, or erase operation of memory cell array 20, row decoder 30 selects one or more wordlines in memory cell array 20 under the control of control block 80, and column decoder 40 controls the operation of Y-gating circuit 60 under the control of control block 80.

During a program operation of memory cell array 20, page buffer 50 receives and stores LSB page data or MSB page data input through Y-gating circuit 60, and programs the stored LSB page data or the stored MSB page data in a page designated by row decoder 30 and column decoder 40. During a read operation of memory cell array 20, page buffer 50 receives and processes (e.g., senses and amplifies) LSB page data or MSB page data output from a page designated by row decoder 30 and column decoder 40, and transmits the processed LSB page data or MSB page data, to Y-gating circuit 60.

Page buffer 50 comprises an LSB page data buffer 50-1 for storing LSB page data and an MSB page data buffer 50-2 for storing MSB page data.

During a program operation of memory cell array 20, Y-gating circuit 60, under the control of column decoder 40, transmits LSB page data or MSB page data transmitted from input/output circuit 70, to page buffer 50. During a read operation, Y-gating circuit 60, under the control of column decoder 40, transmits LSB page data or MSB page data transmitted from page buffer 50, to input/output circuit 70.

Under the control of control block 80, input/output circuit 70 transmits LSB page data or MSB page data to an external destination, or transmits LSB page data or MSB page data input from an external source to Y-gating circuit 60.

Figure 2:
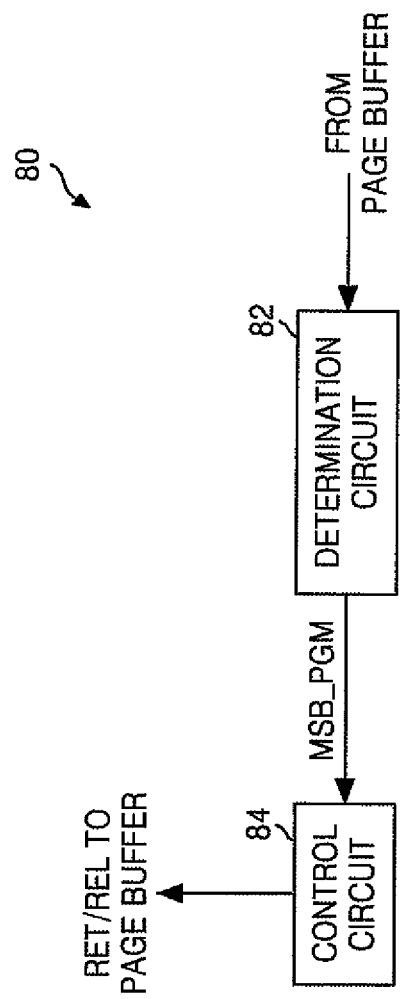
FIG. 2 is a block diagram of a control block illustrated in FIG. 1.
Figure 3:
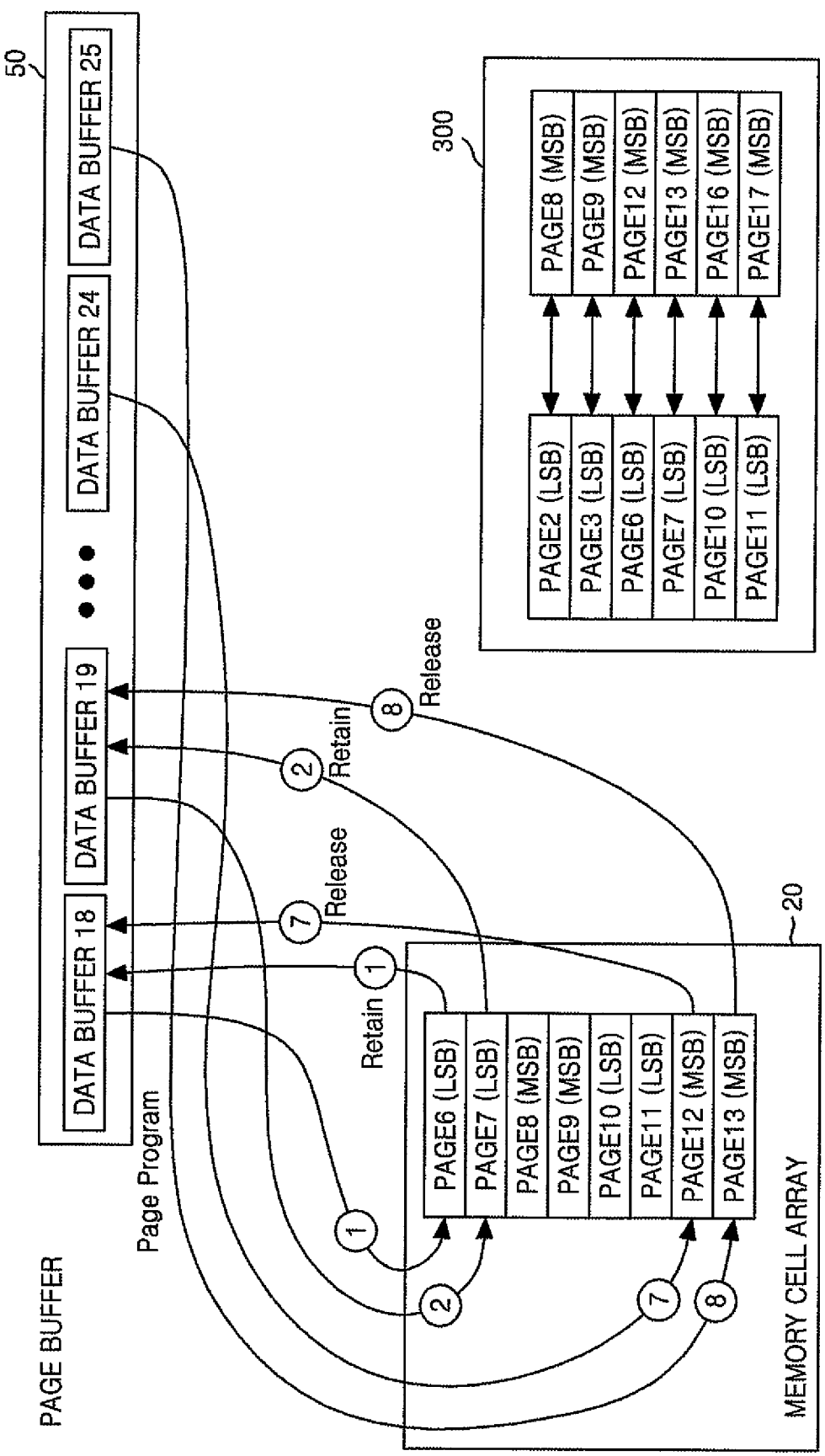
FIG. 3 a data flow diagram for explaining the operation of the control block illustrated in FIG. 2.

FIG. 2 is a block diagram of a control block illustrated in FIG. 1, and FIG. 3 is data flow diagram for explaining the operation of the control block illustrated in FIG. 2. The operation of control block 80 will be explained below with reference to FIGS. 1 through 3. As illustrated by FIG. 1, control block 80 controls program operations, read operation, and erase operations of non-volatile memory device 10 in response to a plurality of control signals CLE, ALE, /WP, /CE, /RE and /WE, where CLE is a command latch enable signal, ALE is an address latch enable signal, /WP is a write protect signal, /CE is a chip enable signal, /RE is a read enable signal and /WE is a write enable signal.

Control block 80 controls LSB page data buffer 50-1 to retain LSB page data between a time when the LSB page data is programmed in a page of memory cell array 20 and a time when MSB page data is successfully programmed in the page of memory cell array 20.

Control block 80 comprises a determination circuit 82 and a control circuit 84. Determination circuit 82 determines whether MSB page data is successfully programmed in a page containing LSB page data, and outputs a corresponding determination result MSB_PGM. Determination circuit 82 also determines whether the LSB page data is successfully programmed and outputs a corresponding determination result to control circuit 84.

Control circuit 84 controls the operation of LSB page data buffer 50-1 according to determination result MSB_PGM. For example, control circuit 84 transmits a retain signal RET or a release signal REL to page buffer 50 according to determination result MSB_PGM. Where determination result MSB_PGM indicates that the MSB page data is not successfully programmed in memory cell array 20, control circuit 84 transmits retain signal RET to page buffer 50 to indicate that the LSB page data should be retained in LSB page data buffer 50-1. Otherwise, control circuit 84 transmits release signal REL to page buffer 50 to release LSB page data buffer 50-1 so that other data can be stored in place of the LSB page data.

In FIG. 3, a program table 300 indicates pairs of LSB page data and MSB page data to be programmed in the same page of memory cells in memory cell array 20. In particular, LSB page data PAGE2 is to be programmed into the same page of memory cells as MSB page data PAGE8, LSB page data PAGE3 is to be programmed into the same page of memory cells as MSB page data PAGE5, and so on.

In FIG. 3, a diagram within memory cell array 20 shows an ordering of page data that has been programmed in various pages. In this example, LSB page data PAGE2 and MSB page data PAGE8 have been successfully programmed in a first page of memory cells in memory cell array 20, LSB page data PAGE3 and MSB page data PAGE9 have been successfully programmed in a second page of memory cells in memory cell array 20, LSB page data PAGE6 and MSB page data PAGE12 have been successfully programmed in a third page of memory cells in memory cell array 20, and LSB page data PAGE7 and MSB page data PAGE13 have been successfully programmed in a fourth page of memory cells in memory cell array 20.

As indicated by the diagram in memory cell array 20, LSB page data PAGE6 is programmed in the third page third page and then retained in a data buffer 18 (①) under the control of control block 80. Thereafter, when MSB page data PAGE12 output from a data buffer 24 is successfully programmed in the third page, control block 80 outputs release signal REL to release data buffer 18 (⑦). In addition, after LSB page data PAGE7 is programmed in the fourth page, LSB page data PAGE7 stored in a data buffer 19 is retained under the control of control block 80 (②). Then, after MSB page data PAGE13 output from a data buffer 25 is successfully programmed in the fourth page, control block 80 outputs a release signal REL to release data buffer 19 (⑧).

Under the control of control block 80, data buffer 18 retains LSB page data PAGE6 until it is determined whether programming of MSB page data PAGE12 has succeeded or failed. Where it is determined that MSB page data PAGE12 is successfully programmed in the third page, control block 80 releases data buffer 18. However, where it is determined that MSB page data PAGE12 is not successfully programmed in the third page, control block 80 uses the retained page data PAGE6 stored in data buffer 18 to perform an error recovery operation such as a bad block map-out.

Control block 80 outputs retain signal RET to page buffer 50 to retain LSB page data in each data buffer until corresponding MSB page data is successfully programmed in an appropriate page of memory cells. Control block 80 releases each data buffer where LSB page data is stored after corresponding MSB page data is successfully programmed in the appropriate page of memory cells. Accordingly, non-volatile memory device 10 prevents loss of LSB page data due to programming failures of MSB page data, and does not require a back-up buffer to back up the LSB page data during programming of MSB page data.

In the example of FIG. 3, page buffers 18 and 19 function as LSB page buffers, and page buffers 24 and 25 function as MSB page buffers.

Figure 4:
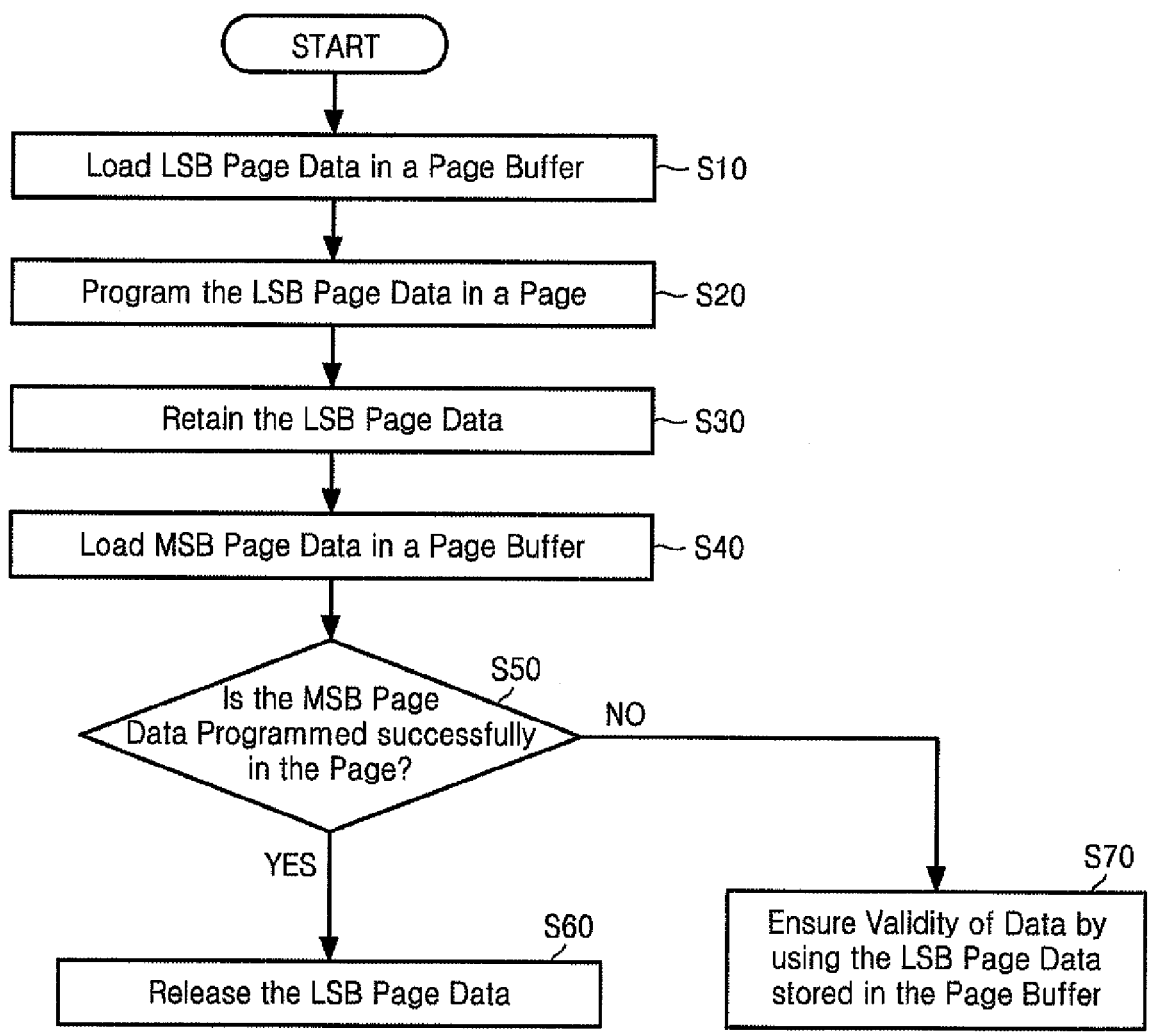
FIG. 4 is a flowchart illustrating a method of operating the non-volatile memory device of FIG. 1.

FIG. 4 is a flowchart for explaining the operation of non-volatile memory device 10 of FIG. 1. The operation of non-volatile memory device 10 will be explained below with reference to FIGS. 1 through 4. In the description that follows, example method steps are indicated by parentheses.

During a program operation of memory cell array 20, LSB page data is loaded in LSB page data buffer 50-1 through input/output circuit 70 and Y-gating circuit 60 (S10). The LSB page data loaded in LSB page data buffer 50-1 is programmed in a page of memory cell array 20 designated by row decoder 30 and column decoder 40 (S20).

The LSB page data is retained in LSB page data buffer 50-1 under the control of control block 80 (S30). MSB page data is then loaded in MSB page data buffer 50-2 through input/output circuit 70 and Y-gating circuit 60 (S40). The MSB page data loaded in MSB page data buffer 50-2 is programmed in the page of memory cell array 20 designated by row decoder 30 and column decoder 40.

Next, control block 80 determines if the MSB page data is successfully programmed in the page (S50). Where the MSB page data is successfully programmed in the page (S50=Yes), control block 80 transmits release signal REL to LSB page data buffer 50-1 to release the LSB page data (S60). Subsequently, the LSB page data stored in LSB page data buffer 50-1 is released.

However, where the MSB page data is not successfully programmed in the page (S50=No), control block 80 protects the validity of the LSB page data by using the LSB page data stored in a LSB page data buffer 50-1, and performs an error recovery operation (S70). Non-volatile memory device 10 retains the LSB page data in LSB page data buffer 50-1 until the MSB page data is successfully programmed in a page of memory cell array 20.

In the method of FIG. 4, even where LSB page data is lost from the page of memory cells due to a program failure of MSB page data, the LSB page data is preserved in LSB page data buffer 50-1. Consequently, the LSB page data can be restored from the LSB page data buffer.

Figure 5:
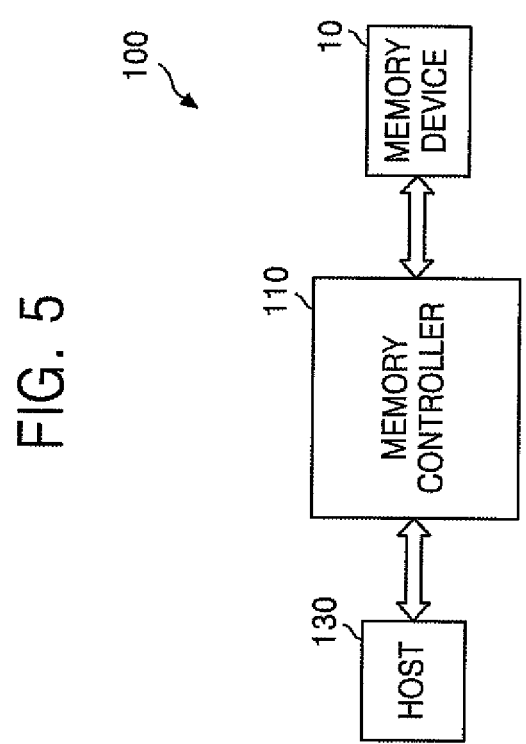
FIG. 5 is a block diagram of a data processing system incorporating the non-volatile memory device of FIG. 1.

FIG. 5 is a block diagram of a data processing system 100 comprising non-volatile memory device 10 of FIG. 1.

Referring to FIG. 5, data processing system 100 comprises non-volatile memory device 10 and a memory controller 110 controlling the operation of non-volatile memory device 10.

In some embodiments, data processing system 100 comprises a smart card or a memory card. In such embodiments, non-volatile memory device 10 and memory controller 110 can be formed in a single chip or in multiple separate chips. In some embodiments, data processing system 100 comprises a personal computer (PC), a portable computer such as a tablet PC, a cellular phone, a smart phone, a personal digital assistant (PDA), a portable multimedia player (PMP), a GPS automotive navigation system, a MP3 player, an audio equipment, a television (TV), a digital camera, or a camcorder. In some embodiments, data processing system 100 comprises a data storage device such as a solid state drive, a memory stick, or a USB memory stick.

Memory controller 110 provides a data communication interface between non-volatile memory device 10 and a host 130. In some embodiments, at least a part of control block 80 is included in controller 110.

As indicated by the foregoing, a non-volatile memory device can maintain LSB page data in a page buffer until MSB page data is successfully programmed in a page of memory cells containing the LSB page data. This can prevent the LSB page data from being lost in the event of an MSB program failure.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of operating a non-volatile memory device, comprising:

programming least significant bit (LSB) page data, stored in an LSB page buffer, in a page of memory cells within the non-volatile memory device; and retaining the LSB page data in the LSB page buffer until most significant bit (MSB) page data corresponding to the LSB page data is programmed in the page of memory cells.

2. The method of claim 1, further comprising releasing the LSB page buffer after the MSB page data is successfully programmed in the page of memory cells.

3. The method of claim 1, wherein non-volatile memory device is a flash memory device, and the memory cells are arranged in a NAND flash configuration.

4. The method of claim 1, further comprising:
performing a program operation to program the MSB page data in the page of memory cells;
determining whether the MSB page data is successfully programmed in the page of memory cells; and
upon determining that the MSB page data is not successfully programmed in the page of memory cells, identifying a memory block containing the page of memory cells as a bad block.

5. The method of claim 1, further comprising:
performing a program operation to program the MSB page data in the page of memory cells;
determining whether the MSB page data is successfully programmed in the page of memory cells; and
upon determining that the MSB page data is not successfully programmed in the page of memory cells, recovering the LSB page data from the LSB page buffer and programming the recovered LSB page data in another page of memory cells in the non-volatile memory device.

6. A non-volatile memory device, comprising:
a page buffer configured to store least significant bit (LSB) page data to be programmed in a page of memory cells; and
a control block configured to control the page buffer to retain the LSB page data until most significant bit (MSB) page data corresponding to the LSB page data is programmed in the page of memory cells.

7. The non-volatile memory device of claim 6, wherein the control block comprises:
a determination circuit for determining whether or not the MSB page data is programmed in the page; and
a control circuit for controlling operations of the page buffer according to a determination result of the determination circuit.

8. The non-volatile memory device of claim 7, wherein, as a consequence of the determination circuit determining that the MSB page data is successfully programmed in the page, the control circuit generates a release signal to release the LSB page data stored in the page buffer.

9. The non-volatile memory device of claim 7, wherein, as a consequence of the determination circuit determining that the MSB page data is not successfully programmed in the page of memory cells, the control circuit controls the non-volatile memory device to identify a memory block containing the page of memory cells as a bad block.

10. The non-volatile memory device of claim 7, wherein, as a consequence of the determination circuit determining that the MSB page data is not successfully programmed in the page of memory cells, the control circuit controls the non-volatile memory device to recover the LSB page data from the LSB page buffer and program the recovered LSB page data in another page of memory cells in the non-volatile memory device.

11. The non-volatile memory device of claim 6, wherein the page comprises a plurality of multi-level flash memory cells.

12. The non-volatile memory device of claim 6, wherein the non-volatile memory device is a flash memory device, and the page comprises a plurality of multi-level cells arranged in a NAND flash configuration.

13. A data processing system, comprising:
a non-volatile memory device comprising a page of memory cells, a page buffer configured to store least significant bit (LSB) page data to be programmed in the page of memory cells, and a control block configured to control the page buffer to retain the LSB page data until MSB page data is programmed in the page; and
a controller configured to output the LSB page data and the MSB page data to the non-volatile memory device.

14. The data processing system of claim 13, wherein the control block comprises:
a determination circuit configured to determine whether the MSB page data is programmed in the page; and
a control circuit configured to control an operation of the page buffer according to a determination result produced by the determination circuit.

15. The data processing system of claim 14, wherein, as a consequence of the determination circuit determining that the MSB page data is successfully programmed in the page, the control circuit releases the LSB page data stored in the page buffer.

16. The data processing system of claim 13, wherein the data processing system is a memory card.

17. The data processing system of claim 13, wherein the data processing system is a solid state drive.

18. The data processing system of claim 13, wherein the page comprises a plurality of multi-level flash memory cells.

19. The data processing system of claim 18, wherein the multi-level flash memory cells are arranged in a NAND flash configuration.

20. The data processing system of claim 18, wherein the multi-level flash memory cells are 2-bit flash memory cells.

* * * * *